US008219375B2

(12) United States Patent
Fukuda

(10) Patent No.: US 8,219,375 B2
(45) Date of Patent: Jul. 10, 2012

(54) PLATED FILM THICKNESS CALCULATING METHOD AND PLATED FILM THICKNESS CALCULATING DEVICE

(75) Inventor: Daisuke Fukuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 390 days.

(21) Appl. No.: 12/534,646

(22) Filed: Aug. 3, 2009

(65) Prior Publication Data

US 2010/0042392 A1    Feb. 18, 2010

(30) Foreign Application Priority Data

Aug. 18, 2008  (JP) .................................. 2008-210120

(51) Int. Cl.
G06F 17/50 (2006.01)
(52) U.S. Cl. .................................... 703/13; 156/345.12
(58) Field of Classification Search .................... 703/13; 438/633; 228/180.5; 257/690, 700; 156/345.11; 216/22; 204/192.1; 347/56, 85
See application file for complete search history.

(56) References Cited

U.S. PATENT DOCUMENTS

| 2002/0053730 | A1* | 5/2002 | Mashino | 257/690 |
|---|---|---|---|---|
| 2004/0129384 | A1* | 7/2004 | Tomari | 156/345.11 |
| 2005/0064703 | A1* | 3/2005 | Kondo et al. | 438/633 |
| 2006/0146102 | A1* | 7/2006 | Kim et al. | 347/85 |
| 2007/0109357 | A1* | 5/2007 | Shin et al. | 347/56 |
| 2007/0228110 | A1* | 10/2007 | Eldridge et al. | 228/180.5 |
| 2008/0128268 | A1* | 6/2008 | Lopatin et al. | 204/192.1 |
| 2008/0128894 | A1* | 6/2008 | Sakano | 257/700 |
| 2008/0149590 | A1* | 6/2008 | Maeda et al. | 216/22 |

FOREIGN PATENT DOCUMENTS

| JP | A 2003-224098 | 8/2003 |
|---|---|---|
| JP | A 2004-40004 | 2/2004 |

OTHER PUBLICATIONS

J. Luo et al., "A Layout Dependent Full-Chip Copper Electroplating Topography Model", International Conference on Computer-Aided Design, 2005, pp. 133-140, Nov. 2005.
T. Gbondo-Tugbawa, "Chip-Scale Modeling of Pattern Dependencies in Copper Chemical Mechanical Polishing Processes", PhD Thesis, Massachusetts Institute of Technology, May 2002.
D. Fukuda et al., "Full-Chip CMP Simulation System", International Conference on Planarization/CMP Technology, 2007.

* cited by examiner

Primary Examiner — Kandasamy Thangavelu
(74) Attorney, Agent, or Firm — Greer, Burns & Crain, Ltd.

(57) ABSTRACT

A computer readable recording medium stores therein a plated film thickness calculating program for a semiconductor integrated circuit producing process in which a plating treatment, a polishing treatment and an over-polishing treatment are performed. The plated film thickness calculating program performing a process includes simulating the plating treatment of plating the surface of the substrate for a given thickness of the conductor; calculating a thickness of the conductor to be removed by the polishing treatment until at least a part of the plateaus appears; calculating a maximum thickness of the conductor to be remained on any part of the plateaus after performing the polishing treatment; and repeating the simulating, the thickness calculation and the maximum thickness calculation by changing the given thickness until a minimum of the given thickness is determined in which the maximum thickness of the remaining conductor becomes less than a predetermined level.

6 Claims, 7 Drawing Sheets

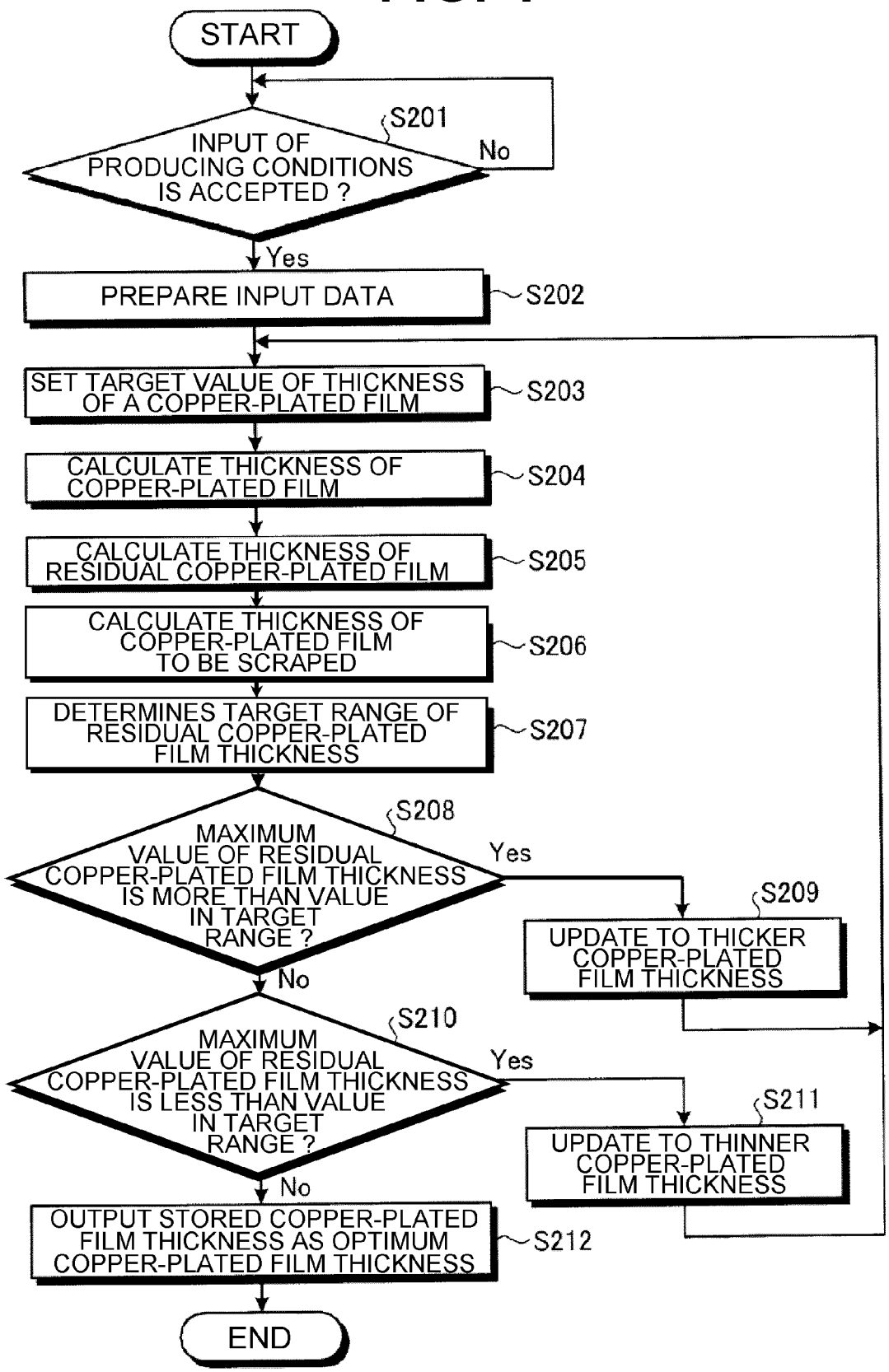

FIG. 5A

|     | (1) | | | | (2) | (3) |
|-----|-----|---|---|---|-----|-----|
| Lay | x | y | dens | edge | ecp | cmp |
| 1 | 0 | 0 | 42.3 | 186 | 1420 | 40 |
| 1 | 1 |   | 38.2 | 186 | 1412 | 34 |
| ... | | | | | | |
| 1 | 19 | 184 | 44.2 | 689 | 1893 | 228 |
| ... | | | | | | |
| 1 | 849 | 848 | 66.3 | 186 | 1334 | 0 |
| 1 | 849 | 849 | 74.8 | 186 | 1337 | 12 |

FIG. 5B

| Lay | x | y | dens | edge | ecp | cmp |
|-----|---|---|------|------|-----|-----|
| 1 | 0 | 0 | 42.3 | 186 | 1720 | 32 |
| 1 | 1 |   | 38.2 | 186 | 1691 | 18 |
| ... | | | | | | |
| 1 | 19 | 184 | 44.2 | 689 | 2093 | 112 |
| ... | | | | | | |
| 1 | 849 | 848 | 66.3 | 186 | 1577 | 2 |
| 1 | 849 | 849 | 74.8 | 186 | 1612 | 0 |

FIG. 5C

| Lay | x | y | dens | edge | ecp | cmp |
|-----|---|---|------|------|-----|-----|
| 1 | 0 | 0 | 42.3 | 186 | 1570 | 32 |
| 1 | 1 |   | 38.2 | 186 | 1481 | 18 |
| ... | | | | | | |
| 1 | 19 | 184 | 44.2 | 689 | 1923 | 158 |
| ... | | | | | | |
| 1 | 849 | 848 | 66.3 | 186 | 1444 | 1 |
| 1 | 849 | 849 | 74.8 | 186 | 1460 | 0 |

PLATED FILM THICKNESS CALCULATING METHOD AND PLATED FILM THICKNESS CALCULATING DEVICE

CROSS-REFERENCE TO RELATED APPLICATION

This application is based upon and claims the benefit of priority of the prior Japanese Patent Application No. 2008-210120, filed on Aug. 18, 2008, the entire contents of which are incorporated herein by reference.

FIELD

The embodiments discussed herein are related to a plated film thickness calculating method.

BACKGROUND

In a general semiconductor integrated circuit producing process, as illustrated in FIG. 7, first, a light-exposing treatment for irradiating a wafer covered with barrier metal with light to form a wiring pattern thereon is performed and then an edging treatment for forming wiring grooves in accordance with the wiring pattern formed by light irradiation is performed. Next, after performing a plating treatment for accumulating copper on the entire surface of the wafer to form a copper-plated film, a polishing treatment for scraping the copper-plated film until the barrier metal appears in a predetermined position on the wafer is performed. Then, an over polishing treatment for scraping an extra copper-plated film accumulated on a portion other than portions under which the wiring grooves are formed (hereinafter, referred to as wiring-groove-formed portions) is performed.

Incidentally, in the case that a state that a copper-plated film remains on a portion other than the wiring-groove-formed portions (that is, a copper residue remains) is observed as illustrated in FIG. 8 after the over polishing treatment has been performed, such trouble may sometimes occur that short-circuiting generates in wiring of a resultant product and hence production yield thereof is decreased. Thus, in order to avoid the above mentioned trouble, prior to production of a circuit, whether a copper residue will generate upon production of the circuit under producing conditions set by a user is evaluated. In the case that it has been evaluated that the copper residue will generate, for example, producing conditions are corrected to increase the thickness of a copper-plated film to reduce a difference in height among copper-plated films obtained after a plating treatment has been performed thereon, thereby avoiding generation of the copper residue.

In this connection, techniques for simulating a semiconductor integrated circuit producing process to predict a result of polishing are disclosed in Japanese Laid-Open Patent Publication Nos. 2004-40004 and 2003-224098, Jianfeng Luo and three others, "A Layout Dependent Full-Chip Copper Electroplating Topography Model", International Conference on Computer-Aided Design, 2005, T. Tugbawa, "Chip-Scale Modeling of Pattern Dependencies in Copper Chemical Mechanical Polishing Processes", PhD thesis, Massachusetts Institute of Technology, 2002, and D. Fukuda and three others, "Full-Chip CMP Simulation System", International Conference on Planarization/CMP Technology, 2007.

However, the related art disclosed in the above mentioned literatures has such a problem that it takes much time to calculate an optimum thickness of a copper-plated film. That is, every time the thickness of a copper-plated film is corrected, simulation of a producing process from the start of a plating treatment to the completion of an over polishing treatment is repeatedly executed and hence such trouble may occur that extra much time is needed to calculate even a copper-plated film thickness with which any copper residue does not generate.

SUMMARY

According to an aspect of the invention, a computer readable recording medium that stores therein a plated film thickness calculating program for a semiconductor integrated circuit producing process in which a plating treatment for plating a surface of a substrate having a plurality of plateaus and grooves with a conductor, a polishing treatment for polishing the plated conductor until a part of the plateaus appears and an over-polishing treatment for polishing until the plated conductor in the plurality of grooves is separated are performed includes simulating the plating treatment of plating the surface of the substrate with the conductor for a given thickness of the conductor to calculate the thickness distribution of the conductor over the plateaus and grooves; calculating a thickness of the conductor to be removed by the polishing treatment until at least a part of the plateaus appears; calculating a maximum thickness of the conductor to be remained on any part of the plateaus after performing the polishing treatment; and repeating the simulating, the thickness calculation and the maximum thickness calculation by changing the given thickness until a minimum of the given thickness is determined in which the maximum thickness of the remaining conductor becomes less than a predetermined level.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a flowchart illustrating a flow of processing performed using a copper-plated film thickness calculating device according to a second embodiment;

FIGS. 5A to 5C are charts illustrating examples of processing performed using the copper-plated film thickness calculating device;

DESCRIPTION OF EMBODIMENTS

Next, embodiments of a plated film thickness calculating program, a plated film thickness calculating device and a plated film thickness calculating method will be described in detail with reference to the accompanying drawings. Incidentally, embodiments of a copper-plated film thickness calculating device will be described.

[First Embodiment]

In the following description of the first embodiment, an outline of a copper-plated film thickness calculating device according to the first embodiment, a configuration of the copper-plated film thickness calculating device and a flow of processing performed using the copper-plated film thickness calculating device will be described in this order. Finally, effect brought about by the device according to the first embodiment will be described.

[Outline of a Copper-Plated Film Thickness Calculating Device According to the First Embodiment]

Figure 1:
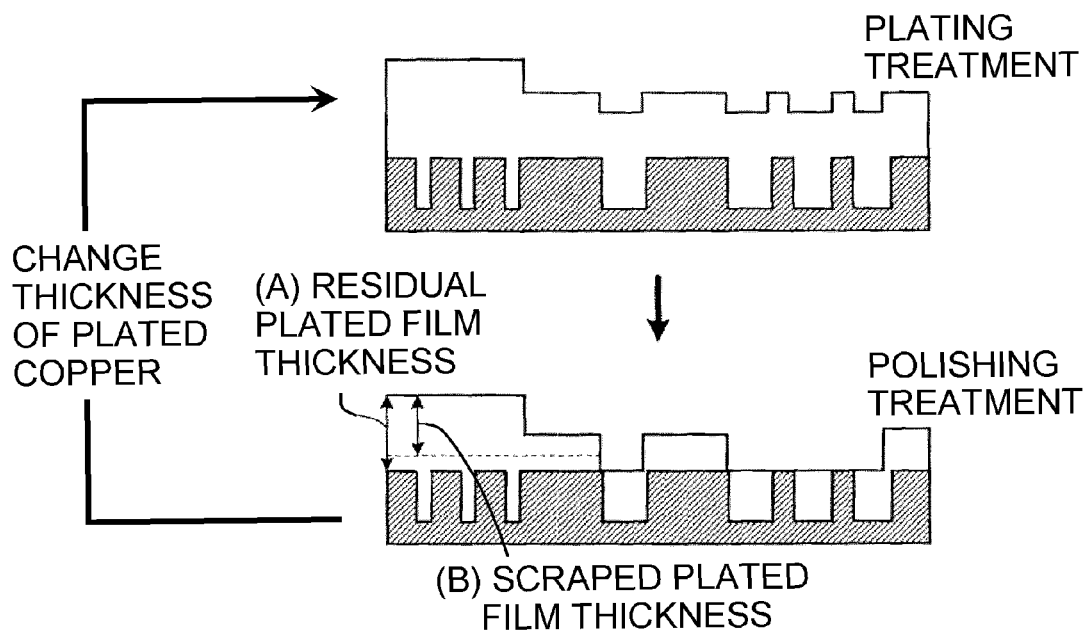
FIG. 1 is a diagram illustrating an outline of a copper-plated film thickness calculating device according to a first embodiment.

First, a copper-plated film thickness calculating device according to the first embodiment will be described with reference to FIG. 1. FIG. 1 is a diagram illustrating the outline of the copper-plated film thickness calculating device according to the first embodiment.

In the copper-plated film thickness calculating device according to the first embodiment, the thickness of a plated film to be scraped by performing an over polishing treatment is calculated using a polishing time and a polishing speed attained upon execution of the over polishing treatment. Then, the copper-plated film thickness calculating device according to the first embodiment operates to repeatedly execute simulation of treatments ranging from a plating treatment to a polishing treatment in order to obtain the thickness of a residual copper-plated film by changing the thickness of copper which is plated on a substrate by performing the plating treatment until the thickness of a residual plated film (illustrated by (A) in FIG. 1) which is predicted to remain on a portion other than wiring-groove-formed portions on the substrate on which the polishing treatment has been performed becomes less than the thickness of a scraped plated film (illustrated by (B) in FIG. 1).

Therefore, the copper-plated film thickness calculating device according to the first embodiment is capable of realizing short-time calculation of an optimum copper-plated film thickness. That is, in the copper-plated film thickness calculating device according to the first embodiment, whether a copper residue generates is determined with no execution of simulation of the over polishing treatment, so that short-time calculation of the optimum copper-plated film thickness is realized.

[Configuration of the Copper-Plated Film Thickness Calculating Device]

Figure 2:
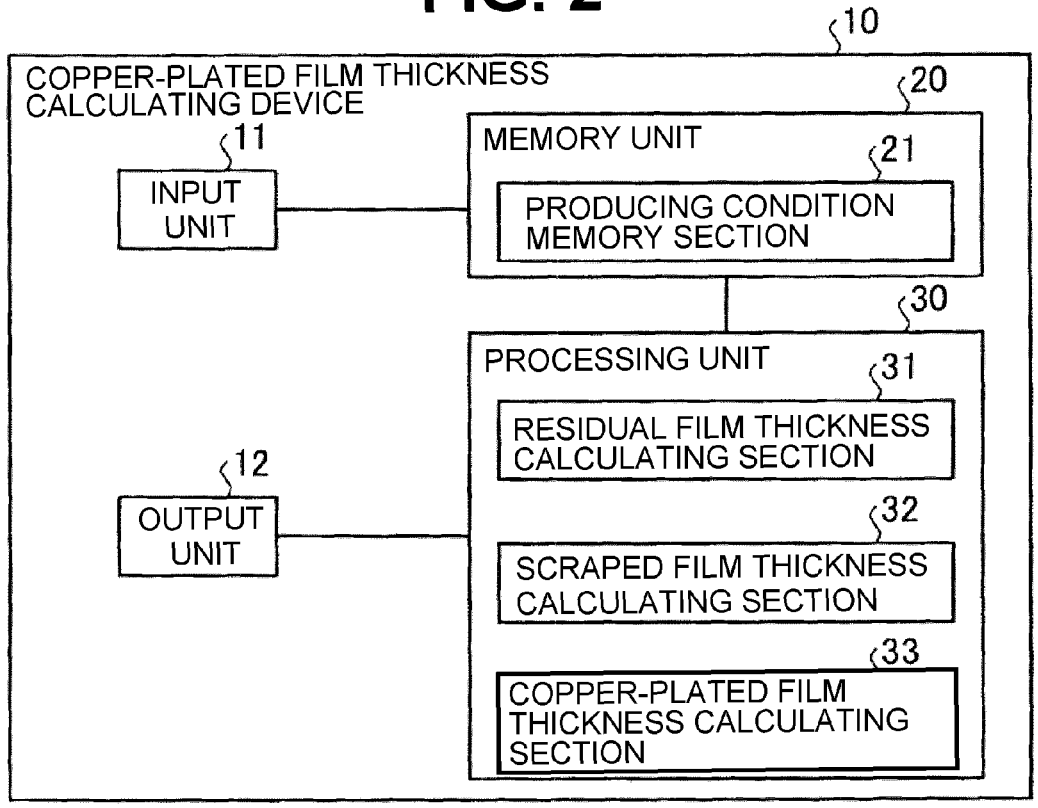
FIG. 2 is a block diagram illustrating a configuration of the copper-plated film thickness calculating device.

Next, a configuration of the copper-plated film thickness calculating device described with reference to FIG. 1 will be described with reference to FIG. 2. FIG. 2 is a block diagram illustrating the configuration of the copper-plated film thickness calculating device. As illustrated in FIG. 2, the copper-plated film thickness calculating device 10 includes an input unit 11, an output unit 12, a memory unit 20 and a processing unit 30.

Among the above mentioned constitutional elements, the input unit 11 accepts input of various kinds of information. Specifically, the input unit 11 is constituted by a keyboard and accepts, for example, chip data including wiring patterns and producing conditions which are set by a user such as an initial thickness of a copper-plated film thickness, a film thickness range, a polishing time and a polishing speed to be stored in the memory unit 20. The output unit 12 outputs various kinds of information. Specifically, the output unit 12 is constituted by a monitor and outputs and displays, for example, a copper-plated film thickness.

The memory unit 20 stores therein data and programs needed for execution of various kinds of processes performed using the processing unit 30. In particular, the memory unit 20 has a producing condition memory section 21 for storing producing conditions prearranged for production of semiconductor integrated circuits. Specifically, the producing condition memory section 21 stores therein producing conditions such as a wiring pattern, a copper-plated film thickness (e.g. a thickness of a copper-plated film on a surface of a substrate without grooves), a polishing time and a polishing speed.

The processing unit 30 has built-in memories for storing controlling programs, programs used to prescribe procedures of various processes and data needed for execution of the programs and executes various processes in accordance with the above mentioned programs and data. In particular, the processing unit 30 has a residual film thickness calculating section 31, a scraped film thickness calculating section 32 and a copper-plated film thickness calculating section 33. Incidentally, the residual film thickness calculating section 31 and the copper-plated film thickness calculating section 33 are also referred to as simulation executing sections. The scraped film thickness calculating section 32 is also referred to as a scraped conductor film thickness calculating section.

The residual film thickness calculating section 31 executes simulation of treatments ranging from the plating treatment to the polishing treatment to calculate the thickness of a residual conductor. Specifically, the residual film thickness calculating section 31 divides the wiring pattern stored in the producing condition memory section 21 into meshes, calculates the copper density indicative of the rate of the area of a wiring groove to the area of a mesh and the ambient wiring length indicative of the total of outer peripheral lengths of wiring grooves and prepares input data used to predict a result of polishing.

Next, the residual film thickness calculating section 31 sets the copper-plated film thickness stored in the producing condition memory section 21 to a target value of the thickness of a copper-plated film to be accumulated by performing the plating treatment and executes simulation of the plating treatment to calculate the thickness of a accumulated copper-plated film in each mesh. Then, the residual film thickness calculating section 31 executes simulation of the polishing treatment by using the accumulated copper-plated film thickness so calculated, a layout of arrangement of meshes and a polishing speed at which the polishing treatment is performed to calculate the thickness of a residual copper-plated film in each mesh.

The scraped film thickness calculating section 32 calculates the scraped copper-plated film thickness by using the polishing time and the polishing speed attained upon execution of the over polishing treatment. Specifically, the residual film thickness calculating section 31 integrates the polishing time and the polishing speed attained upon execution of the over polishing treatment which have been input through the input unit 11 to calculate the scraped copper-plated film thickness. As an alternative, the scraped film thickness calculating section 32 may calculate the scraped copper-plated film thickness also on the basis of a variation in polishing speed which would occur when a real polishing treatment is performed. In addition, in order to avoid generation of a copper residue after a real over polishing treatment has been performed, a margin for underestimating the thickness of a copper-plated film to be scraped upon execution of the over polishing treatment may be set.

The copper-plated film thickness calculating section 33 changes the film thickness of copper plated on a wafer by performing the plating treatment until the residual copper-plated film thickness becomes less than the scraped copper-plated film thickness and operates to make the copper-plated film thickness calculating section 33 repeatedly execute simulation of treatments ranging from the plating treatment to the polishing treatment.

Specifically, the copper-plated film thickness calculating section 33 compares a maximum value of the residual copper-plated film thickness calculated using the residual film thickness calculating section 31 with the scraped copper-plated film thickness. As a result of comparison, in the case that the maximum value of the residual copper-plated film thickness is more than the scraped copper-plated film thickness, the copper-plated film thickness calculating section 33 updates the copper-plated film thickness stored in the producing condition memory section 21 to a copper-plated film thickness thicker than the currently stored copper-plated film thickness.

That is, since the difference in height among copper-plated films obtained after execution of the plating treatment is so great with the initial film thickness which has been set by the user and hence a copper residue may possibly generate after execution of the over polishing treatment, the copper-plated film thickness calculating section 33 controls to make the copper-plated film thickness further thicker such that any copper residue does not generate finally. Incidentally, in the case that an updated copper-plated film thickness is more than an upper limit value in the film thickness range, the copper-plated film thickness calculating section 33 may output an error indicating that an optimum copper-plated film thickness is not calculated under the producing conditions set by the user.

Then, every time the copper-plated film thickness stored in the producing condition memory section 21 is updated, the copper-plated film thickness calculating section 33 resets the updated copper-plated film thickness to the target value of the thickness of a copper-plated film to be accumulated by performing the plating treatment. Then, the copper-plated film thickness calculating section 33 operates to make the residual film thickness calculating section 31 execute simulation of the plating treatment and the polishing treatment so as to repeatedly calculate the residual copper-plated film thickness. Then, when the residual copper-plated film thickness becomes less than the scraped copper-plated film thickness, the copper-plated film thickness calculating section 33 outputs the copper-plated film thickness stored in the producing condition memory section 21 as an optimum copper-plated film thickness through the output unit 12. As an alternative, the copper-plated film thickness calculating section 33 may correct the copper-plated film thickness on the basis of a film-forming variation in copper-plated film thickness which would occur when a real plating treatment is performed to be output as the optimum copper-plated film thickness.

[Processing Performed Using the Copper-Plated Film Thickness Calculating Device]

Figure 3:
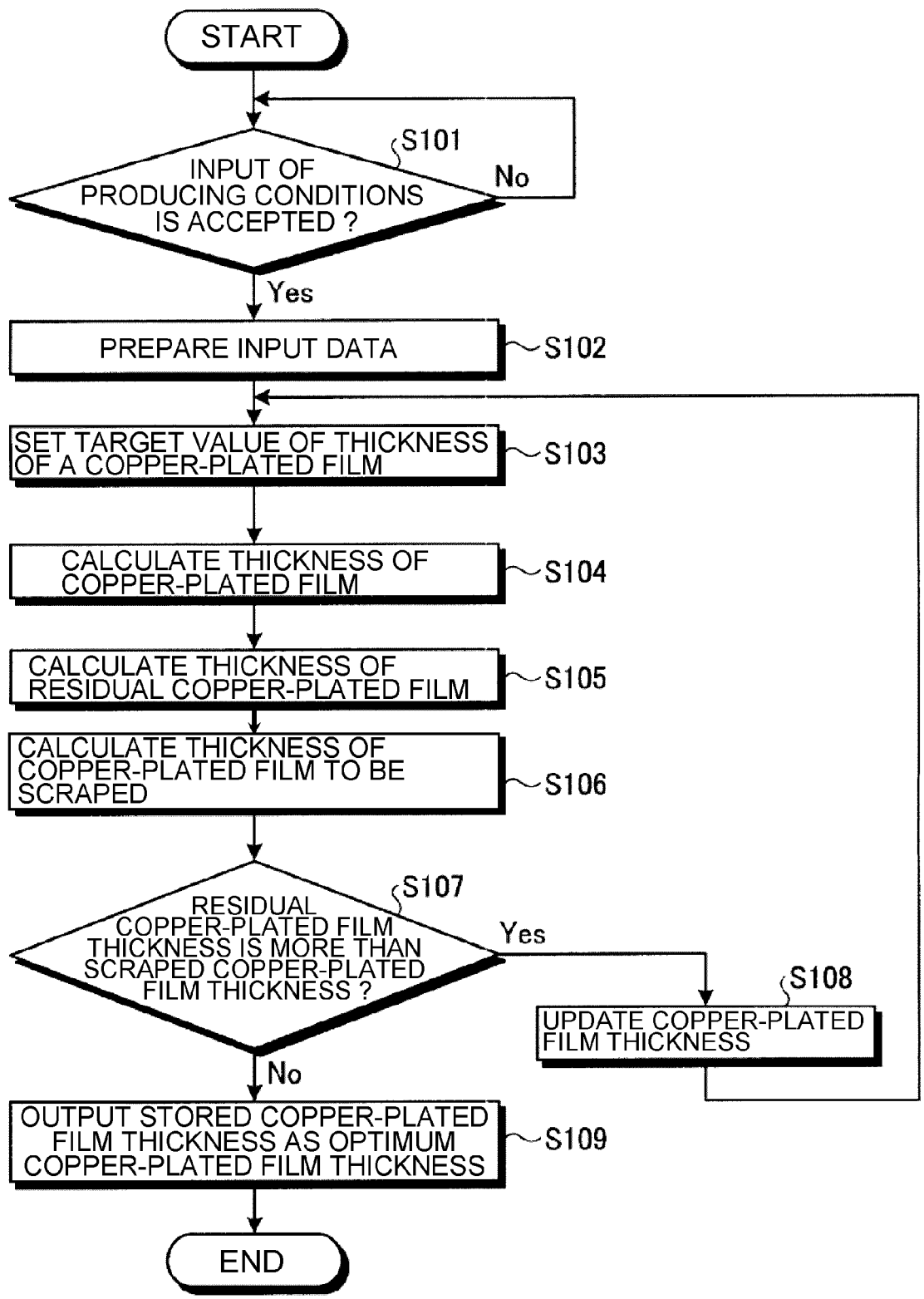
FIG. 3 is a flowchart illustrating a flow of processing performed using the copper-plated film thickness calculating device.

Next, processing performed using the copper-plated film thickness calculating device 10 will be described with reference to FIG. 3 which illustrates a flowchart of a flow of processing performed using the copper-plated film thickness calculating device 10. As illustrated in FIG. 3, when an input of producing conditions is accepted (yes at step S101), the residual film thickness calculating section 31 prepares input data used to predict a result of polishing (step S102). Next, the residual film thickness calculating section 31 sets an initial copper-plated film thickness set by a user to a target value of the thickness of a copper-plated film to be accumulated by performing a plating treatment (step S103) and executes simulation of the plating treatment to calculate the thickness of the copper-plated film to be accumulated (step S104).

Then, the residual film thickness calculating section 31 executes simulation of the polishing treatment to calculate the thickness of a residual copper-plated film (step S105) and the scraped film thickness calculating section 32 calculates the thickness of a copper-plated film to be scraped using a polishing time and a polishing speed attained upon execution of an over polishing treatment (step S106). Then, the copper-plated film thickness calculating section 33 compares the residual copper-plated film thickness with the scraped copper-plated film thickness (step S107).

In this situation, in the case that the residual copper-plated film thickness is more than the scraped copper-plated film thickness (yes at step S107), the copper-plated film thickness calculating section 33 updates the copper-plated film thickness stored in the producing condition memory section 21 to a copper-plated film thickness which is thicker than the currently stored film thickness (step S108). Then, every time the copper-plated film thickness is updated, the copper-plated film thickness calculating section 33 resets a target value of the copper-plated film thickness (step S103) and operates to make the residual copper-plated film thickness calculating section 31 repeatedly execute calculation of the accumulated copper-plated film thickness (step S104) and calculation of the residual copper-plated film thickness (step S105).

Then, when the residual copper-plated film thickness becomes less than the scraped copper-plated film thickness (no at step S107), the copper-plated film thickness calculating section 33 outputs the copper-plated film thickness stored in the producing condition memory section 21 as an optimum copper-plated film thickness (step S109) to terminate the processing.

[Effect of the First Embodiment]

As described above, according to the first embodiment, short time calculation of the optimum copper-plated film thickness is possible. For example, the copper-plated film thickness calculating device 10 according to the first embodiment needs simulate only the plating treatment and the polishing treatment every time the copper-plated film thickness is corrected, so that short time calculation of the optimum copper-plated film thickness is realized.

In addition, according to the first embodiment, the scraped copper-plated film thickness is calculated using the polishing speed obtained by taking a variation in the polishing speed which would occur upon production into consideration, short time calculation of the copper-plated film thickness with which any copper residue does not generate with certainty becomes possible.

[Second Embodiment]

Incidentally, if a copper-plated film is too thick, it will take much time to perform a polishing treatment on the too thick copper-plated film and hence it will sometimes occur that throughput upon production is reduced. Thus, in the second embodiment, the case where a copper-plated film thickness with which any copper residue does not generate and the throughput upon production is increased is calculated will be described. In the following description of the second embodiment, a configuration of a copper-plated film thickness calculating device according to the second embodiment, a flow of processing to be performed using the copper-plated film thickness calculating device and an example of the processing to be performed using the copper-plated film thickness calculating device will be described in this order and finally, effect brought about by the device according to the second embodiment will be described.

[Configuration of the Copper-Plated Film Thickness Calculating Device]

The copper-plated film thickness calculating device according to the second embodiment differs from the copper-plated film thickness calculating device 10 according to the first embodiment in the points which will be described as follows. That is, in the second embodiment, the copper-plated film thickness calculating section 33 changes the film thickness of a conductor plated on a substrate by performing a plating treatment until a maximum value of a residual copper-plated film thickness falls within a range of predetermined values which have been set in advance to be less than a value of a scraped copper-plated film thickness and operates to make the residual film thickness calculating section 31 execute simulation of treatments ranging from a plating treatment to a polishing treatment.

Specifically, the copper-plated film thickness calculating section 33 determines the range of predetermined values which have been set in advance to be less than the scraped copper-plated film thickness value calculated using the scraped film thickness calculating section 32 as a target range of residual copper-plated film thickness values and compares a maximum value of the residual copper-plated film thickness calculated using the residual film thickness calculating section 31 with a value in the target range. In the case that the maximum value of the residual copper-plated film thickness is more than the value in the target range, the copper-plated film thickness calculating section 33 updates the copper-plated film thickness stored in the producing condition memory section 21 to a copper-plated film thickness thicker than the currently stored copper-plated film thickness.

On the other hand, in the case that the maximum value of the residual copper-plated film thickness is less than the value in the target range, the copper-plated film thickness calculating section 33 updates the copper-plated film thickness stored in the producing condition memory section 21 to a copper-plated film thickness thinner than the currently stored copper-plated film thickness. That is, the copper-plated film thickness set by the user is too thick and hence it takes much time to perform the polishing treatment on a plated-film of the thickness set by the user and as a result of which there is the possibility that the throughput attained upon real production may be reduced. Therefore, in this case, the copper-plated film thickness calculating section 33 operates to make the copper-plated film thickness thinner. As an alternative, in the case that when a value obtained after the previous film thickness has been updated is less than a lower limit value in the film thickness range, the copper-plated film thickness calculating section 33 may output an error indicating that any optimum copper-plated film thickness is not calculated under producing conditions set by the user.

Then, every time the copper-plated film thickness stored in the producing condition memory section 21 is updated, the copper-plated film thickness calculating section 33 resets a newly updated copper-plated film thickness to a target value of the thickness of the copper-plated film to be accumulated by performing the plating treatment. Then, the copper-plated film thickness calculating section 33 operates to make the residual film thickness calculating section 31 execute simulation of the plating treatment and the polishing treatment to repeatedly calculate the residual copper-plated film thickness. Then, when the copper-plated film thickness falls within the target range, the copper-plated film thickness calculating section 33 outputs the copper-plated film thickness stored in the producing condition memory section 21 as an optimum copper-plated film thickness via the output unit 12.

[Processing Performed Using the Copper-Plated Film Thickness Calculating Device]

Next, processing performed using the copper-plated film thickness calculating device 10 according to the second embodiment will be described with reference to FIG. 4. FIG. 4 is a flowchart illustrating a flow of processing performed using the copper-plated film thickness calculating device 10 according to the second embodiment. Note that different points of the flow illustrated in FIG. 4 from that of the processing performed using the copper-plated film thickness calculating device 10 according to the first embodiment will be described in detail.

As illustrated in FIG. 4, when the thickness of a copper-plated film to be scraped is calculated using the scraped film thickness calculating section 32 (step S206), the copper-plated film thickness calculating section 33 determines a target range of residual copper-plated film thickness values (step S207). Next, the copper-plated film thickness calculating section 33 compares a maximum value of the residual copper-plated film thickness with a value in the determined target range (step S208 and step S210).

In this situation, in the case that the maximum value of the residual copper-plated film thickness is more than the value in the target range (yes at step S208), the copper-plated film thickness calculating section 33 updates the copper-plated film thickness stored in the producing condition memory section 21 to a copper-plated film thickness thicker than the currently stored film thickness (step S209). On the other hand, in the case that the maximum value of the residual copper-plated film thickness is less than the value in the target range (yes at step S210), the copper-plated film thickness calculating section 33 updates the copper-plated film thickness stored in the producing condition memory section 21 to a copper-plated film thickness thinner than the currently stored film thickness (step S211).

Then, every time the copper-plated film thickness is updated, the copper-plated film thickness calculating section 33 resets a newly updated film thickness to a target value of the copper-plated film thickness (step S203) and operates to make the residual film thickness calculating section 31 repeatedly execute calculation of the thickness of a copper-plated film to be accumulated (step S204) and calculation of the residual copper-plated film thickness (step S205). Then, when the residual copper-plated film thickness falls within the target range (no at step S210), the copper-plated film thickness calculating section 33 outputs the copper-plated film thickness stored in the producing condition memory section 21 as an optimum copper-plated film thickness (step S212) and terminates the processing.

[Examples of Processing Performed Using the Copper-Plated Film Thickness Calculating Device]

Next, examples of processing performed using the copper-plated film thickness calculating device 10 will be described with reference to FIGS. 5A to 5C. FIGS. 5A to 5C are charts for explaining examples of the processing performed using the copper-plated film thickness calculating device. In the following examples, it is supposed that a semiconductor integrated circuit is formed on a barrier-metal-covered surface of a wafer of "8.5 cm×8.5 cm" in size and a wiring pattern is divided into meshes every "10 μm". It is also supposed that chip data including parameters indicative of various producing conditions such as the initial film thickness "1500 nm" of a copper-plated film, a film thickness range of values from "1000 to 1800 nm", the polishing time "30 sec. (0.5 min.)" for which an over polishing treatment is performed, the polishing speed "500 nm/min." at which the over polishing treatment is performed, the variation in polishing speed "±50 nm/min.", the margin "50 nm" and the film forming variation "50 nm", and wiring patterns have been input in advance by a user.

First, the residual film thickness calculating section 31 divides the wiring pattern into meshes and obtains position information (x, y) used for specifying the position of each mesh, a copper density (dens) and an ambient wiring length (edge) of each mesh as illustrated by (1) in FIG. 5A. In the chart, "lay" is information used for specifying of which layer is being currently produced in a semiconductor integrated circuit producing process for forming a multi-layered configuration.

Next, as illustrated by (2) in FIG. 5A, the residual film thickness calculating section 31 executes simulation of a plating treatment to calculate the accumulated copper-plated film thickness (ecp: Electro-Chemical Plating simulated value). In the example illustrated in FIG. 5A, the accumulated copper-plated film thickness is indicated by a value obtained by averaging heights measured from the lowermost part of a wiring groove to the top of a copper-plated film.

Then, the residual film thickness calculating section 31 executes simulation of the polishing treatment until the thickness of a residual copper-plated film in any one of the meshes is reduced to "0" (that is, until it is predicted that the barrier metal will appear in a predetermined position on a substrate) as illustrated by (3) in FIG. 5A, to calculate the residual copper-plated film thickness (cmp: Chemical Mechanical Polishing simulated value). Here, the residual copper-plated film thickness is indicated by a value obtained by averaging heights measured from the barrier metal to the top of the copper-plated film.

Then, the scraped film thickness calculating section 32 multiplies a value obtained by subtracting a variation in polishing speed from the polishing speed of the over polishing treatment and the polishing time of the over polishing treatment and subtracts the margin from a result of multiplication to calculate the thickness of a copper-plated film to be scraped. That is, the scraped copper-plated film thickness amounts to (500−50)*0.5−50=175 (nm).

Then, the copper-plated film thickness calculating section 33 determines the range of values from "175 nm" to "150 nm" as a target range of values of the residual copper-plated film thickness. In the example illustrated in FIG. 5A, the maximum value "228 nm" of the residual copper-plated film thickness is larger than any value in the target range, so that the copper-plated film thickness calculating section 33 updates the copper-plated film thickness stored in the producing condition memory section 21 to a thicker copper-plated film thickness such that a value thereof may be equal to, for example, the maximum value "1800 nm" in the film thickness range.

Then, as illustrated in FIG. 5B, the residual film thickness calculating section 31 executes again simulation of the plating treatment and the polishing treatment to again calculate the accumulated copper-plated film thickness and the residual copper-plated film thickness. In the example illustrated in FIG. 5B, the maximum value "112 nm" of the residual copper-plated film thickness is smaller than any value in the target range, so that the copper-plated film thickness calculating section 33 updates the copper-plated film thickness stored in the producing condition memory section 21 to a thinner copper-plated film thickness such that a value thereof may be equal to, for example, the intermediate value "1650 nm" between the previously stored copper-plated film thickness "1500 nm" and the secondarily stored copper-plated film thickness "1800". When the maximum value of the residual copper-plated film thickness is larger than any value in the target range, if the stored copper-plated film thickness is updated to a thicker copper-plated film thickness, the updated copper-plated film thickness will exceed the upper limit value in the film thickness range. In this case, the residual film thickness calculating section 31 outputs an error indicating that any optimum copper-plated film thickness could not be calculated.

Then, as illustrated in FIG. 5C, the residual film thickness calculating section 31 again calculates the accumulated copper-plated film thickness and the residual copper-plated film thickness by using the reset copper-plated film thickness. In the example illustrated in FIG. 5C, since the maximum value "158 nm" of the residual copper-plated film thickness falls within the target range, the copper-plated film thickness calculating section 33 corrects the copper-plated film thickness "1650 nm" to "1700 nm" on the basis of the film-forming variation "50 nm" and outputs the corrected value.

[Effect of the Second Embodiment]

As described above, according to the second embodiment, the copper-plated film thickness with which any copper residue does not generate and the throughput upon production is increased can be calculated in a short time period.

[Third Embodiment]

The first and second embodiments have been described. However, the present invention may be embodied in variously different aspects other than the above mentioned embodiments. Next, a further embodiment will be described as a third embodiment.

For example, in the second embodiment, the case where the copper-plated film thickness stored in the producing condition memory section 21 is updated so as to be equal to the copper-plated film thickness calculated by using dichotomy has been described. However, the present invention is not limited thereto, but a predetermined value (for example, 100 nm) may be increased/decreased.

In addition, processing procedures, controlling procedures, definite designations and information including various data and parameters (for examples, the parameters illustrated in FIG. 5A to 5C) may be optionally altered unless otherwise specified.

The respective constitutional elements of the respective devices illustrated in the drawings are merely conceptual ones in function and need not be always physically configured as illustrated in the drawings. That is, the specific aspects in dispersion and combination of elements in each device are not limited to those illustrated in the drawings, but may be configured by functionally or physically dispersing and combining with one another all or some of the constitutional elements in units of optionally selected sets of elements in accordance with various loads imposed thereon and conditions under which each device is used. For example, the residual film thickness calculating section 31 and the copper-plated film thickness calculating section 33 illustrated in FIG. 2 may be configured in a combined form.

In addition, all or optionally selected ones of functions of respective processes performed using the respective devices may be implemented using a CPU and in accordance with programs analyzed and executed using the CPU concerned or may be implemented in the form of hardware on the basis of wired logic.

Figure 6:
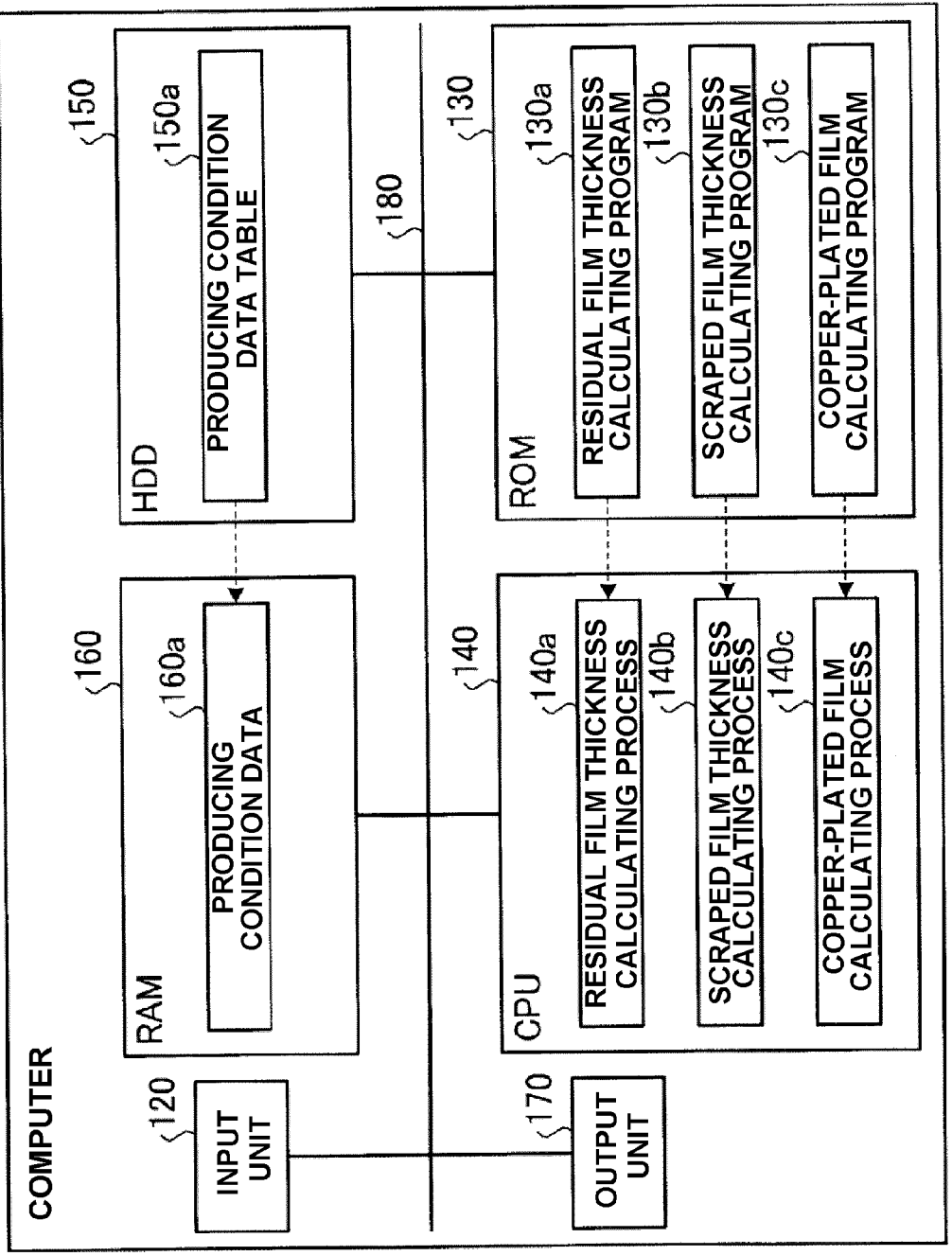
FIG. 6 is a diagram illustrating a configuration of a computer used for executing a plated film thickness calculating program.
Figure 7:
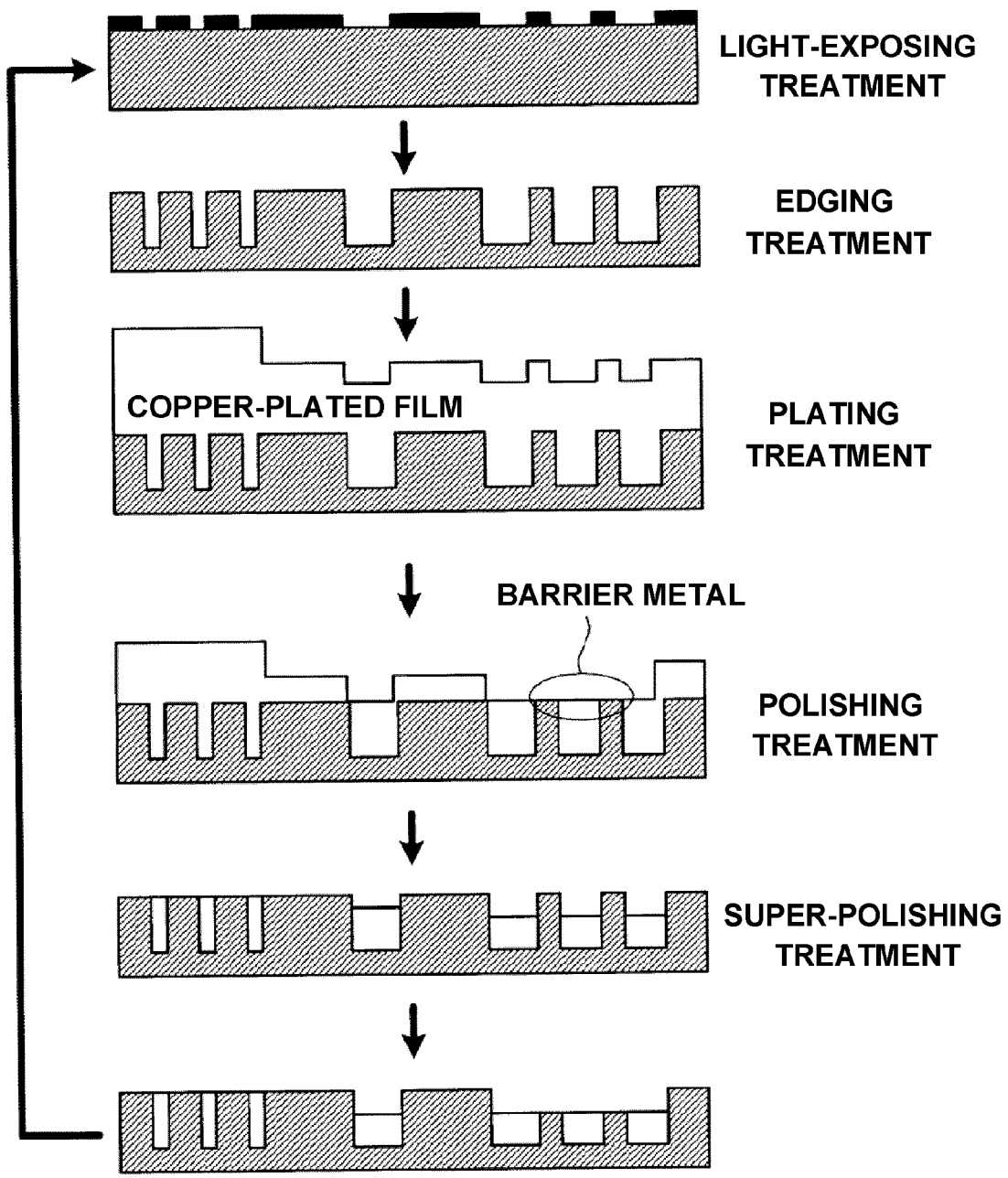
FIG. 7 is a diagram illustrating related art.
Figure 8:
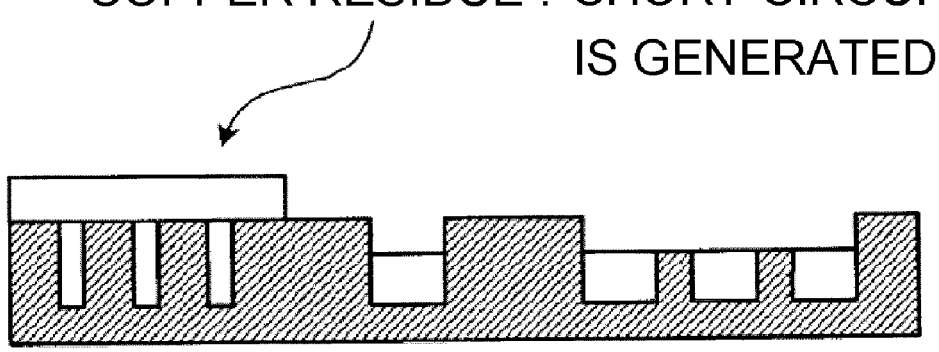
FIG. 8 is a diagram illustrating related art.

Incidentally, the present invention may be implemented by executing a program which has been prepared in advance using a computer serving as the copper-plated film thickness calculating device 10. Thus, in the following, a computer for executing a plated-film thickness calculating program having the same functions as the copper-plated film thickness calculating devices 10 described in the first and second embodiments will be described by way of example with reference to FIG. 6. FIG. 6 is a diagram illustrating a computer for executing the plated-film thickness calculating program.

As illustrated in FIG. 6, a computer 110 serving as the copper-plated film thickness calculating device 10 is configured by connecting an input unit 120, a ROM 130, a CPU 140, an HDD 150, a RAM 160 and an output unit 170 together via a bus 180.

In the ROM 130, plated-film thickness calculating programs exhibiting the same functions as the copper-plated film thickness calculating device 10 according to the first embodiment, that is, a residual film thickness calculating program 130a, a scraped film thickness calculating program 130b and a copper-plated film thickness calculating program 130c are stored in advance as illustrated in FIG. 6. Incidentally, the programs 130a to 130c may be appropriately combined with one another or disposed as in the case with the respective constitutional elements of the copper-plated film thickness calculating device 10 illustrated in FIG. 2.

Then, the CPU 140 reads out the programs 130a to 130c from the ROM 130 and executes functions thereof, by which the programs 130a to 130c come to function as a residual film thickness calculating process 140a, a scraped film thickness calculating process 140b and a copper-plated film calculating process 140c. Incidentally, the processes 140a to 140c respectively correspond to the residual film thickness calculating section 31, the scraped film thickness calculating section 32 and the copper-plated film thickness calculating section 33 illustrated in FIG. 2.

As illustrated in FIG. 6, a producing condition data table 150a is installed in the HDD 150. The CPU 140 reads out producing condition data from the producing condition data table 150 to be stored in the RAM 160 and executes processes on the basis of data 160a to 160c stored in the RAM 160. The RAM 160 corresponds to the producing condition memory section 21 illustrated in FIG. 2.

The above mentioned programs 130a to 130c need not be always stored in the ROM 130 from the beginning, but the respective programs may be stored in, for example, a "portable physical medium" inserted into the computer 110 such as a flexible disk (FD), a CD-ROM, a DVD disk, a magneto-optical disk or an IC card, a "fixed physical medium" installed inside or outside the computer 110 such as an HDD, or "another computer (or a server)" connected to the computer 110 via a public line, Internet, LAN or WAN and the computer 110 may read out and execute the respective programs stored in the above mentioned medium.

In addition, by using the copper-plated film thickness calculating device described in the first embodiment, such a plated-film thickness calculating method as follows is implemented. That is, in a semiconductor integrated circuit producing process in which a plating treatment, a polishing treatment and an over polishing treatment are performed in this order, there is implemented a plated-film thickness calculating method including the scraped conductor thickness calculating step (see step S106 in FIG. 3) of calculating the thickness of a conductor which is scraped by performing the over polishing treatment on the basis of a polishing time and a polishing speed attained upon execution of the over polishing treatment and the simulation executing step (see steps S103 to S105, S107 and S108) of repeatedly executing simulation of treatments ranging from the plating treatment to the polishing treatment performed in order to obtain the thickness of a residual conductor by changing the thickness of the conductor plated on a substrate by performing the plating treatment until the thickness of the residual conductor which is predicted to be remained on a portion other than wiring-groove-formed portions on the substrate on which the polishing treatment has been performed becomes less than the scraped conductor thickness calculated at the scraped conductor thickness calculating step.

According to the plated film thickness calculating program, the plated film thickness calculating device and the plated film thickness calculating method of the present invention, short time calculation of an optimum plated film thickness is possible.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer readable recording medium that stores therein executable instructions of a plated film thickness calculating program which when executed on a computer perform simulation of a semiconductor integrated circuit producing process in which a plating treatment for plating a surface of a substrate having a plurality of plateaus and grooves with a conductor, a polishing treatment for polishing the plated conductor until a part of the plateaus appears and an over-polishing treatment for polishing until the plated conductor in the plurality of grooves is separated are performed, the executable instructions of the plated film thickness calculating program performing a process comprising:

simulating the plating treatment of plating the surface of the substrate with the conductor for a given thickness of the conductor to calculate the thickness distribution of the conductor over the plateaus and grooves;

calculating a thickness of the conductor to be removed by the polishing treatment until at least a part of the plateaus appears;

calculating a remaining maximum thickness of the conductor on any part of the plateaus after performing the polishing treatment; and repeating the simulating to calculate the thickness distribution, the thickness to be removed calculation and the remaining maximum thickness calculation by changing the given thickness until a minimum of the given thickness is determined in which the remaining maximum thickness of the conductor becomes less than a predetermined level.

2. The computer readable recording medium according to claim 1, wherein the predetermined level is determined by calculating a thickness of the conductor to be removed by performing the over-polishing treatment using an over-polishing time and an over-polishing speed.

3. The computer readable recording medium according to claim 2, wherein the calculation of the thickness of the conductor to be removed by performing the over-polishing treatment is on the basis of a variation in polishing speed which would occur when an actual polishing treatment is performed.

4. The computer readable recording medium according to claim 2, wherein the predetermined level is equal to or less than the thickness of the conductor to be removed by performing the over-polishing treatment.

5. A plated film thickness calculating device executing a plated film thickness calculating program in a semiconductor integrated circuit producing process in which a plating treatment for plating a surface of a substrate having a plurality of plateaus and grooves with a conductor, a polishing treatment for polishing the plated conductor until a part of the plateaus appears and an over-polishing treatment for polishing until the plated conductor in the plurality of grooves is separated are performed, the plated film thickness calculating device comprising:

a memory to store instructions of the plated film thickness calculating program; and a cpu to execute the instructions of the plated film thickness calculating program in the memory, wherein the instructions of the plated film thickness calculating program performing a process include:

simulating the plating treatment of plating the surface of the substrate with the conductor for a given thickness of the conductor to calculate the thickness distribution of the conductor over the plateaus and grooves;

calculating a thickness of the conductor to be removed by the polishing treatment until at least a part of the plateaus appears;

calculating a remaining maximum thickness of the conductor on any part of the plateaus after performing the polishing treatment; and repeating the simulating to calculate the thickness distribution, the thickness to be removed calculation and the remaining maximum thickness calculation by changing the given thickness until a minimum of the given thickness is determined in which the remaining maximum thickness of the conductor becomes less than a predetermined level.

6. A method for calculating a thickness of a plated film in a semiconductor integrated circuit producing process in which a plating treatment for plating a surface of a substrate having a plurality of plateaus and grooves with a conductor, a polishing treatment for polishing the plated conductor until a part of the plateaus appears and an over-polishing treatment for polishing until the plated conductor in the plurality of grooves is separated are performed, the method comprising:

executing by a computer operations of;

simulating the plating treatment of plating the surface of the substrate with the conductor for a given thickness of the conductor to calculate the thickness distribution of the conductor over the plateaus and grooves;

calculating a thickness of the conductor to be removed by the polishing treatment until at least a part of the plateaus appears;

calculating a remaining maximum thickness of the conductor on any part of the plateaus after performing the polishing treatment; and repeating the simulating to calculate the thickness distribution, the thickness to be removed calculation and the remaining maximum thickness calculation by changing the given thickness until a minimum of the given thickness is determined in which the remaining maximum thickness of the conductor becomes less than a predetermined level.

* * * * *